(12) United States Patent
Nicolas

(10) Patent No.: US 9,018,043 B2
(45) Date of Patent: Apr. 28, 2015

(54) METHOD OF ENCAPSULATING A MICRO-DEVICE BY ANODIC BONDING

(71) Applicant: Commissariat a l'energie atomique et aux ene alt, Paris (FR)

(72) Inventor: Stephane Nicolas, Meylan (FR)

(73) Assignee: Commissariat a l'energie atomique et aux energies alternatives, Paris (FR)

( * ) Notice: Subject to any disclaimer, the term of this patent is extended or adjusted under 35 U.S.C. 154(b) by 0 days.

(21) Appl. No.: 14/198,947

(22) Filed: Mar. 6, 2014

(65) Prior Publication Data

US 2014/0273351 A1        Sep. 18, 2014

(30) Foreign Application Priority Data

Mar. 13, 2013   (FR) ...................... 13 52217

(51) Int. Cl.
    *B81C 1/00*        (2006.01)
(52) U.S. Cl.
    CPC ......... *B81C 1/00269* (2013.01); *B81C 1/00285* (2013.01); *B81C 2201/019* (2013.01); *B81C 2203/0118* (2013.01); *B81C 2203/031* (2013.01)
(58) Field of Classification Search
    CPC ............ B81C 1/00277; B81C 1/00285; B81C 1/00293
    USPC ...................................................... 438/456
    See application file for complete search history.

(56) References Cited

U.S. PATENT DOCUMENTS

| 5,591,679 A | 1/1997 | Jakobsen et al. |
| 7,421,767 B2 | 9/2008 | Aoki |
| 7,436,076 B2 | 10/2008 | Stahl et al. |
| 8,164,174 B2 | 4/2012 | Laermer |
| 2007/0006434 A1 | 1/2007 | Aoki |
| 2007/0087465 A1 | 4/2007 | Stahl et al. |
| 2008/0099908 A1 | 5/2008 | Wang et al. |
| 2014/0038364 A1 | 2/2014 | Nicolas et al. |

FOREIGN PATENT DOCUMENTS

DE    10 2004 043 120 A1    3/2006

OTHER PUBLICATIONS

French Preliminary Search Report issued Oct. 18, 2013 in French Application 13 52217, filed on Mar. 13, 2013 (with English Translation of Categories of Cited Documents).
U.S. Appl. No. 14/264,62, filed Apr. 29, 2014, Nicolas.

(Continued)

*Primary Examiner* — Daniel Luke
(74) *Attorney, Agent, or Firm* — Oblon, McClelland, Maier & Neustadt, L.L.P.

(57) ABSTRACT

A method for encapsulating at least one micro-device, comprising at least the following steps:

bonding a face of a first substrate comprising at least one material impermeable to noble gases, in contact with a second substrate comprising glass and with a thickness of about 300 μm or more;

etching at least one cavity through the second substrate such that side walls of the cavity are at least partly formed by remaining portions of the second substrate and that an upper wall of the cavity is formed by part of said face of the first substrate;

anodic bonding of the remaining portions of the second substrate in contact with a third substrate in which the micro-device is formed, such that the micro-device is encapsulated in the cavity.

10 Claims, 3 Drawing Sheets

(56) References Cited

OTHER PUBLICATIONS

R. Tiwari et al., "The Silicon-to-Silicon Anodic Bonding Using Sputter Deposited Intermediate Glass Layer", J. Nano-Electron. Phys., 3 (2011) No. 1, pp. 418-425.

A. Gerlach et al., "Low-temperature Anodic Bonding of Silicon to Silicon Wafers by Means of Intermediate Glass Layers", Microsystem Technologies, vol. 5, (1999), pp. 144-149.

P. Krause et al., "Silicon to Silicon Anodic Bonding Using Evaporated Glass", Transducers '95, Eurosensors IX, Jun. 25-29, 1995, pp. 228-231.

METHOD OF ENCAPSULATING A MICRO-DEVICE BY ANODIC BONDING

TECHNICAL DOMAIN AND PRIOR ART

The invention relates to the field of microelectronics and more particularly to packaging, or encapsulation, of micro-devices such as the MEMS and/or NEMS type micro-devices, in order to hermetically encapsulate these micro-devices in cavities in which the atmosphere can be controlled, using anodic bonding.

Encapsulation of a micro-device firstly provides it with protection against external elements (humidity, particulate pollution, reactive elements such as oxygen or other non-neutral gases) and secondly controls the pressure and composition of the atmosphere in the cavity in which the micro-device is encapsulated (the composition refers to the nature of the gas(es) that will be enclosed in the cavity with the micro-device). Encapsulation pressures are highly variable depending on the application of the micro-device, and are usually between 1 bar and $10^{-3}$ mbars.

Therefore a recurrent constraint that occurs in the packaging field is to be able to have very precise control over the gas pressure and composition in the cavities.

For example for a gyroscope type micro-device, a high vacuum is usually necessary for it to operate correctly. Depending on the target performances of the gyroscope, the pressure range required in the cavity is between $10^{-1}$ mbars and $10^{-4}$ mbars for the highest performance devices. For an RF switch type micro-device, a pressure close to atmospheric pressure is sufficient, but a "neutral" gas environment is required for example to prevent oxidation of the switch contact zone. Consequently, non-reactive gases like $N_2$, Ar, He, etc., have to be used for such an encapsulation.

Micro-devices are usually encapsulated at the scale of the substrate through the use of a collective encapsulation method for several micro-devices simultaneously, which can reduce packaging and therefore fabrication costs of these micro-devices. Such an encapsulation can be done either by transferring thin layers directly onto the substrate comprising the micro-devices (<<Thin Layer Packaging>> (TLP) method), or by hermetic sealing of a second substrate called a cap substrate on the first substrate in which the micro-devices are formed. In this case the cavities can be made in the cap substrate in advance.

In the case of encapsulation by bonding between two substrates, there are different techniques for obtaining a hermetic assembly of the first substrate with the cap substrate including molecular bonding, metal bonding, sintered glass bonding, or anodic bonding.

Anodic bonding which can give very good hermeticity requires the use of a glass cap substrate, for example made of borosilicate type glass, containing sodium ions capable of moving in glass under the effect of an electric field applied during bonding. However, such a borosilicate type glass substrate has the disadvantage of being permeable to noble gases such as helium or argon. This means that a non-negligible quantity of noble gas can enter the cavity through the cap substrate after bonding and thus degrade the required residual pressure and composition in the cavity. This creates a major problem of reliability in the case of a micro-device that, in order to be functional, requires precise control of the residual pressure and/or the nature of the gas composition in the cavity in which it is encapsulated. Furthermore, strong oxygen degassing occurs in the cavity during anodic bonding: when an electric field is applied during bonding, sodium ions migrate onto the external surface of the glass and on the other hand, oxygen ions contained in the glass migrate to the internal surface of the substrate and thus enter into the cavity, thus modifying the required atmosphere in the cavity.

Anodic bonding can also be done through the use of an intermediate glass layer, for example made of borosilicate type glass, deposited by a vacuum deposition technique (of the Physical Vapor Deposition type, or PVD type) on the cap substrate. Deposition of such an intermediate glass layer is described for example in document "The silicon-to-silicon anodic bonding using sputter deposited intermediate glass layer", R. Tiwari et al., J. Nano-Electron. Phys.; 3 (2011) No 1, P. 418-425.

Documents U.S. Pat. No. 5,591,679 and US 2007/0006434 A1 also describe the production of such an intermediate glass layer. Document US 2007/087465 A1 describes the production of a cap substrate formed by the assembly of a silicon substrate with a thin glass layer, then assembled by anodic bonding with a second substrate in which a micro-device is formed. The cap substrate has several cavities that have been partially etched in glass.

Although the use of such a thin glass layer formed in contact with a cap substrate comprising another material impermeable to noble gases reduces problems with permeability to noble gases encountered with a cap substrate made of glass alone, these glass layers raise problems with brittleness and risks of breakage during their fabrication and manipulation before bonding with the substrate in which the micro-devices are formed. Furthermore, the production of such a thin glass layer requires the use of a PVD deposition which is a long and expensive process. Finally, such a glass layer does not provide a solution to the problem of oxygen degassing that occurs in the cavity during anodic bonding.

Therefore, none of the methods according to prior art is capable of anodic bonding while guaranteeing a precise control of the atmosphere (in terms of pressure and/or composition) in the cavity in which the micro-device is encapsulated.

PRESENTATION OF THE INVENTION

One purpose is to disclose a method of encapsulating a micro-device by anodic bonding capable of providing precise control of the atmosphere (pressure and/or composition) in the cavity in which the micro-device is encapsulated, preventing the use of a PVD deposition and reducing risks of breakage and brittleness related to the use of a thin glass layer.

To achieve this, one embodiment discloses a method for encapsulating at least one micro-device, comprising at least the following steps:

bonding a face of a first substrate comprising at least one material impermeable to noble gases, in contact with a second substrate comprising glass and with a thickness of about 300 µm or more;

etching at least one cavity through the second substrate such that side walls of the cavity are at least partly formed by remaining portions of the second substrate and that an upper wall of the cavity is formed by at least part of said face of the first substrate;

anodic bonding of the remaining portions of the second substrate in contact with a third substrate in which the micro-device is formed, such that the micro-device is encapsulated in the cavity.

The upper wall of the cavity may be formed by a part of said face of the first substrate.

The remaining portions of the second substrate form a hermetically sealed joint between the first substrate and the third substrate.

Since the first substrate comprises at least one material impermeable to noble gases, these gases cannot penetrate into the cavity through the cap substrate once the micro-device has been encapsulated. Furthermore, the fact that the upper wall of the cavity is formed by part of the first substrate and not by glass, very much reduces the quantity of oxygen that can diffuse into the cavity during anodic bonding.

Furthermore, the fact that the cap substrate is formed by the first substrate to which the second glass substrate is bonded prevents the application of a PVD deposition, and therefore reduces the encapsulation costs of the micro-device.

Finally, the use of the second glass substrate with a thickness greater than or equal to about 300 μm solves brittleness problems encountered with thin glass layers used in methods according to prior art. For example, when the second glass substrate corresponds to a cylindrical layer (wafer) with a diameter of about 150 mm, its thickness may be greater than or equal to about 300 μm. When the second glass substrate corresponds to a cylindrical layer with a diameter equal to about 200 mm, its thickness may be greater than or equal to about 500 μm.

When the second glass substrate corresponds to a cylindrical layer with a diameter equal to about 300 mm, its thickness may be greater than or equal to about 775 μm.

The second glass substrate forms an autonomous substrate, in other words a substrate with sufficient mechanical strength so that it is self standing and can therefore be manipulated without risk of breakage, particularly before and during bonding with the first substrate.

The encapsulation structure obtained comprises a support (corresponding to the third substrate) hermetically assembled by anodic bonding to a cap comprising a cavity containing at least one micro-device, for example of the MEMS and/or NEMS type. The cap is formed by a hermetic substrate (first substrate) on which a thick structured glass layer is arranged to form the cavity, anodic bonding being done between said glass layer and the peripheral support of the cavity.

The third substrate may comprise at least one material impermeable to noble gases, for example silicon.

The material impermeable to noble gases may be silicon, and/or the glass in the second substrate may be of the borosilicate type.

The method may also comprise a step prior to anodic bonding, to produce a getter material on part of said face of the first substrate and/or at least on part of the side walls of the cavity and/or on at least part of the third substrate intended to be arranged in the cavity. Addition of a getter material in the cavity assures the quality of the atmosphere inside the cavity by trapping possible residual gases such as oxygen, nitrogen, hydrogen, water, carbon monoxide or even carbon dioxide, and possibly obtaining a high vacuum in the cavity (for example a pressure less than about $10^{-1}$ mbars).

The method may also comprise thinning of the second substrate between the step for bonding the first substrate in contact with the second substrate and the step for etching the cavity, to a thickness preferably greater than or equal to about 10 μm, and for example between the initial thickness of the second substrate and about 10 μm.

The method may also comprise a step to make at least a portion of material impermeable to noble gases at least in contact with the cavity side walls, between the cavity etching step and the anodic bonding step. The result obtained is that this cavity is entirely hermetically sealed to noble gases.

The portion of material impermeable to noble gases may comprise at least one metal (for example titanium and/or aluminium and/or copper) and/or silicon.

The portion of material impermeable to noble gases may also cover the upper wall of the cavity.

The portion of material impermeable to noble gases may form a layer also in contact with the remaining portions of the second substrate, anodic bonding of the remaining portions of the second substrate in contact with the third substrate may be carried out between the portion of material impermeable to noble gases and the third substrate.

The method may perform collective encapsulation of several micro-devices in distinct cavities, and it may also comprise a cut-out in at least the first substrate and the third substrate after anodic bonding of the remaining portions of the second substrate in contact with the third substrate, such that each of the encapsulated micro-devices forms a chip.

In the case of a collective encapsulation method, the second substrate may be precut between the different chips that will be made, before bonding with the third substrate. Precutting may be done by etching the second substrate over its entire thickness at the same time as the cavities are being made in the second substrate. Thus, precutting of the glass does not require an additional step, but only the use of an etching mask suitable for simultaneous etching of cavities and trenches separating the cavities of the different chips. If a precut is made in the second substrate, individualisation of the chips after bonding only requires a cutout of the first and third substrates. Otherwise, the first, second and third substrates are cut out after bonding with the third substrate.

In this case, the method may also comprise, after the cutting step, a step for depositing at least one layer of material impermeable to noble gases in contact with at least external side walls of the remaining portions of the second substrate. This deposition can thus make the cavity fully hermetically sealed to noble gases.

BRIEF DESCRIPTION OF THE DRAWINGS

This invention will be better understood after reading the description of example embodiments given purely for information and in no way limitative with reference to the appended drawings on which.

Identical, similar or equivalent parts of the different figures described below have the same numeric references to facilitate comparisons between the different figures.

The different parts shown in the figures are not necessarily at the same scale, to make the figures more easily understandable.

The various possibilities (variants and embodiments) should be understood as being not exclusive of each other and they can be combined together.

DETAILED PRESENTATION OF PARTICULAR EMBODIMENTS

We will firstly refer to FIGS. 1A to 1D that diagrammatically show the steps in a first embodiment of an encapsulation method for a micro-device 100, for example of the MEMS and/or NEMS type.

Figure 1A:
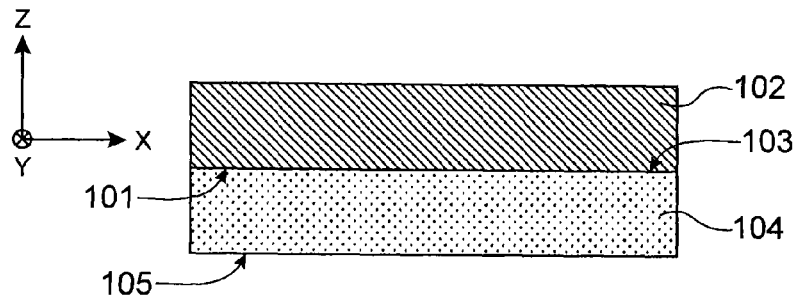
FIGS. 1A to 1E diagrammatically show the steps in a method of encapsulating a micro-device according to a first embodiment.

As shown in FIG. 1A, the cap of the encapsulation structure is firstly made from a first substrate 102 comprising at least one material impermeable to noble gases (helium, argon, etc.) such as a semiconductor, for example silicon. The first substrate 102 is bonded to a second solid substrate 104 comprising glass with a thickness (dimension along Z axis shown in FIG. 1A) equal for example to about 500 µm or more.

In this case the first substrate 102 and the second substrate 104 correspond to cylindrical shape wafers with a diameter (dimension in the (X,Y) plane) equal to about 200 mm. Bonding between the first substrate 102 and the second substrate 104 is done by anodic bonding between the two substrates, at a first face 101 of the first substrate 102 and a first face 103 of the second substrate 104. In this case, the nature of the glass in the second substrate 104, for example borosilicate glass such as float borosilicate glass of the Borofloat® type is chosen such that it is compatible for making anodic bonding with the first substrate 102. As a variant, the second substrate 104 may be bonded to the first substrate 102 by direct bonding or molecular bonding.

Figure 1B:
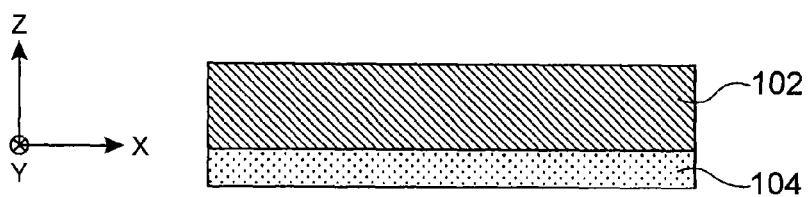

The second substrate 104 is then thinned at a face 105 opposite face 103 such that the thickness of a remaining glass layer corresponding to the thinned second substrate 104 is between 10 µm and the initial thickness of the second substrate 104, in this case equal to 500 µm (FIG. 1B). This thinning may for example be done by mechanical polishing («grinding») followed by chemical mechanical planarization (CMP)) at the face 105 of the second substrate 104, or by a chemical etching followed by CMP at face 105.

As a variant, the thinning step of the second substrate 104 is not necessarily carried out and the entire thickness of the second substrate 104 may be kept for subsequent steps.

The second substrate 104, thinned or not, is then structured by etching a cavity 108 in it, in which the micro-device 100 will be encapsulated. The cavity 108 is formed in the entire remaining thickness of the second substrate 104 by wet etching.

Figure 1C:
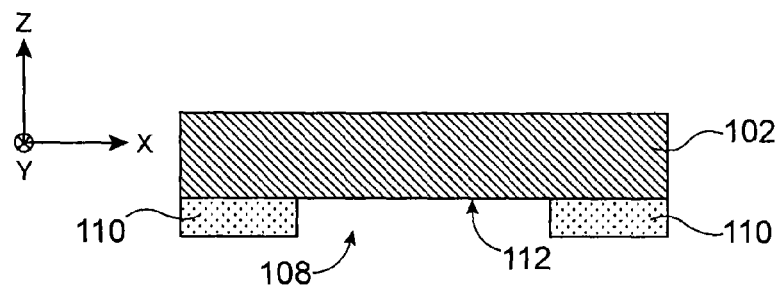

Therefore in this case, the height (dimension along Z axis) of the cavity 108 corresponds to the thickness of the remaining glass layer corresponding to the second substrate 104 that may or may not be thinned. Remaining portions 110 of the second substrate 104 form peripheral walls, or side walls of the cavity 108, while part 112 of the face 101 of the first substrate 102 initially bonded to the second substrate 104 forms the upper wall of the cavity 108 (FIG. 1C).

Figure 1D:
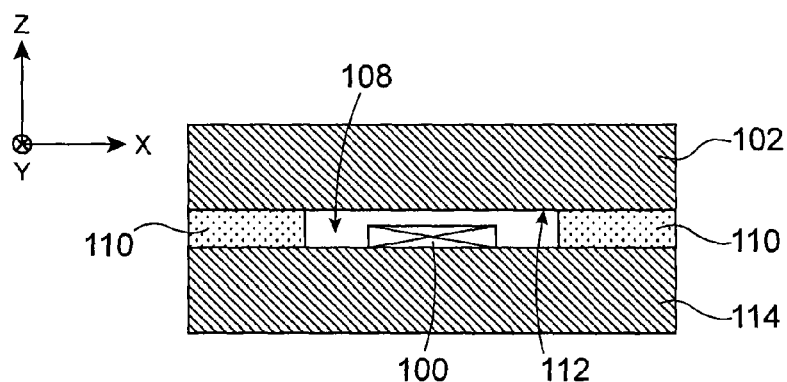

The encapsulation method is completed by anodic bonding between the remaining portions 110 of the second substrate 104 and a third substrate 114, in this case semiconductor-based such as silicon, on which the micro-device 100 is made in advance, such that the micro-device 100 is encapsulated in the cavity 108 that is delimited by the first substrate 102, the remaining portions 110 of the second substrate 104 and the third substrate 114 (FIG. 1D). Anodic bonding may be carried out in a gaseous atmosphere corresponding to that required in the cavity 108, for example at a pressure between the atmospheric pressure and high vacuum (for example between about $10^{-2}$ mbars and $10^{-4}$ mbars) and/or in the presence of particular gases that can provide satisfactory operation of the micro-device 100, for example such as nitrogen.

The encapsulation method described above uses borosilicate or borofloat® type glass perfectly suitable for the use of anodic bonding with the semiconducting substrate on which the micro-device to be encapsulated is made. This method can also prevent problems of brittleness and risks of breakage due to manipulations of a thin glass layer during encapsulation because the glass layer used to make the side walls of the cavity is made from a thick glass substrate 104 bonded to the first substrate 102 before possible thinning, this first substrate 102 acting as a mechanical handle during manipulations of the glass layer once it has been made.

The initial thickness of the glass substrate 104 (at least 300 µm) is also sufficient so that it can be manipulated before it is bonded to the first substrate 102 without causing any brittleness problems or risk of breakage that may occur with a thin glass layer.

The cavity 108 is defined or formed in the entire thickness of the glass layer corresponding to the second substrate 104 that may or may not be thinned. Therefore, the height of the cavity 108 may be between few microns, for example 10 µm, and the initial thickness of the glass substrate 104, for example equal to 500 µm or equal to about 1 mm.

Furthermore, the internal glass surface of the cavity 108 is limited to the side walls formed by the portions 110 of the second substrate 104. Thus, the quantity of oxygen degassed by glass and entering the cavity 108 during anodic bonding is strongly limited in comparison with an encapsulation structure comprising a glass cap or a glass layer covering the side walls and the upper wall of the cap, or more generally an encapsulation structure in which the side walls and the top wall of the cavity are made of glass.

Figure 1E:
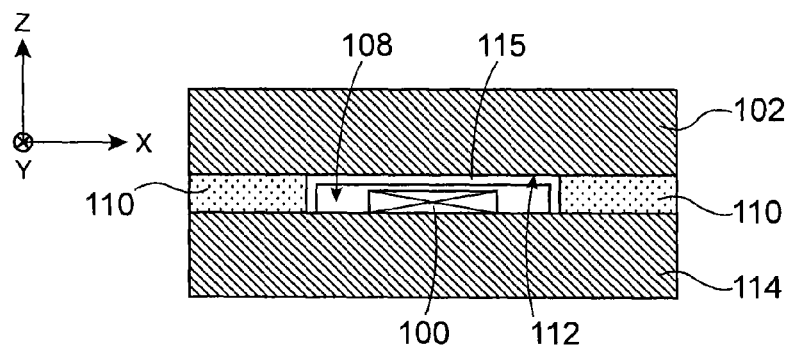

In one variant embodiment, it is possible to deposit a getter material 115 on the first substrate 102 (at least at part of the upper wall of the cavity 108) and/or on at least part of the side walls of the cavity 108 formed by the portions 110 of the second substrate 104 and/or on the third substrate 114 (at least at part of the lower wall of the cavity 108), before bonding with the third substrate 114. Such a variant embodiment is shown in FIG. 1E, on which a getter material layer 115 is formed in contact with the part 112 of the face 101 of the first substrate 102 and in contact with the side walls of the cavity 108 formed by the portions 110 of the second substrate 104.

Refer now to FIGS. 2A to 2D that show some of the steps in a method of encapsulating the micro-device 100 according to a second embodiment.

Figure 2A:
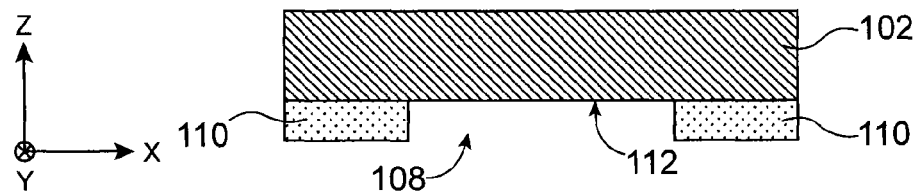
FIGS. 2A to 2D diagrammatically show some of the steps in a micro-device encapsulation method, according to a second embodiment.

The steps previously described with reference to FIGS. 1A to 1C are firstly carried out, thus forming the cavity 108 delimited by the remaining glass portions 110 bonded to the first substrate 102 (FIG. 2A).

Figure 2B:
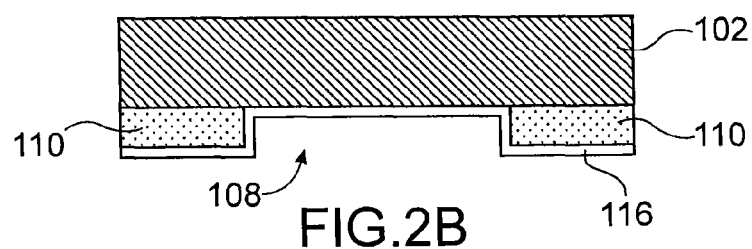

As shown in FIG. 2B, a layer 116 of material designed to form a barrier against noble gases, in other words that is impermeable to noble gases, is deposited on the walls of the cavity 108, in other words on portions 110 and on part 112 of the face of the first substrate 102 forming the upper wall of the cavity 108.

This layer 116 for example comprises at least one metallic material such as titanium, aluminium or copper, deposited by PVD. The thickness of the layer 116 is for example between about 0.5 µm and 2 µm.

Figure 2C:
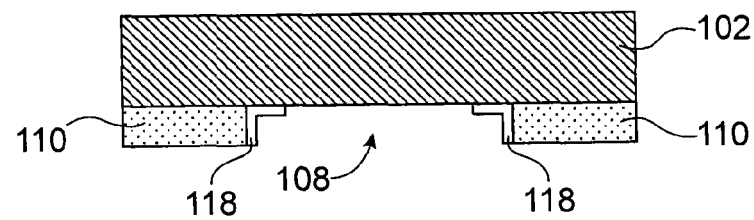

The layer 116 is then etched to keep only the remaining portions 118 of the layer 116 covering the side walls of the cavity 108 formed by glass portions 110 (FIG. 2C). The upper wall of the cavity 108 is also partly covered by these remaining portions 118. However, it is possible that the remaining portions 118 of the layer 116 only cover the side walls of the cavity 108.

Figure 2D:
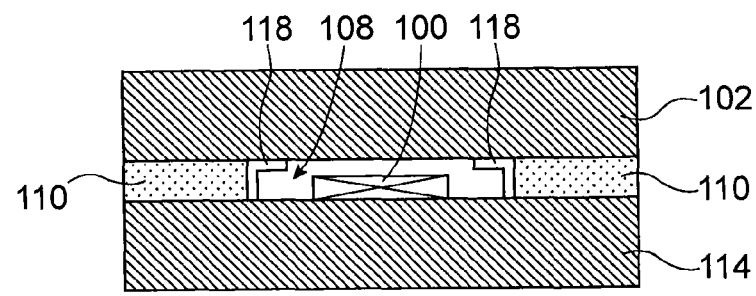

The encapsulation method is then completed by anodic bonding of the glass portions 110 with the third substrate 114, encapsulating the micro-device 100 in the cavity 108 (FIG. 2D).

Thus in this second embodiment, the side walls of the cavity 108 are impermeable to noble gases because of the presence of the portions 118 of metallic material forming a screen to these noble gases that possibly pass through glass portions 110.

Figure 3:
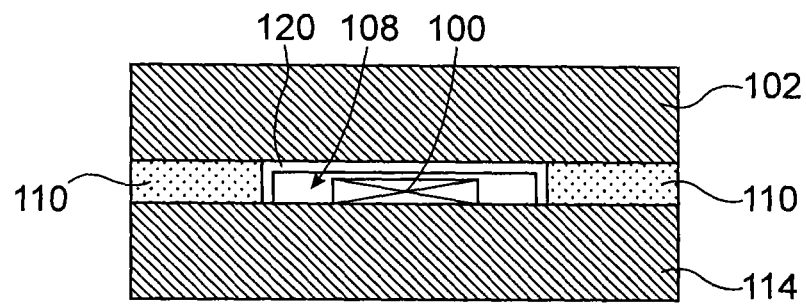
FIGS. 3 to 5 diagrammatically show encapsulation structures obtained with a micro-device encapsulation method according to various embodiments.

In a first variant embodiment shown in FIG. 3, it is possible that the metallic layer 116 is structured such that a remaining portion 120 of this layer covers the side walls of the cavity 108, in other words the side walls formed by the portions 110, and the entire upper wall of the cavity 108, in other words the entire part 112 of the face of the first substrate 102.

Figure 4:
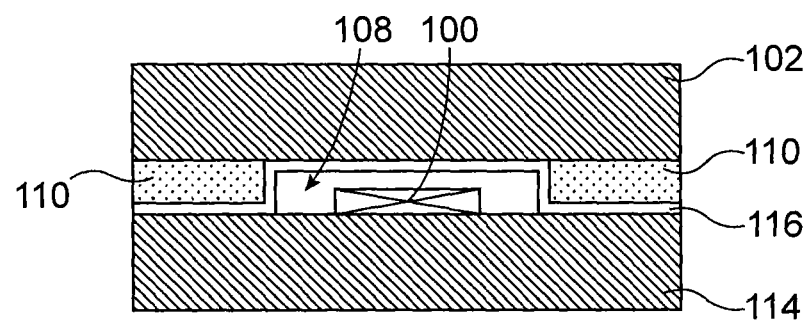

In a second variant embodiment shown in FIG. 4, it is possible that the metallic layer 116 is not structured. In this case, anodic bonding is done between the third substrate 114 and the metallic layer 116, the metallic layer 116 then preferably being made from an easily oxidisable metallic material for example such as titanium or aluminium.

Figure 5:
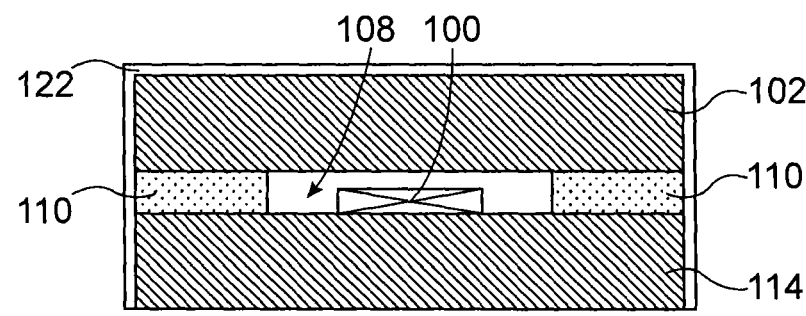

Another solution for preventing possible permeation of noble gases in the cavity 108 through the glass portions 110 may consist of making an encapsulation structure previously described with reference to FIGS. 1A-1D, and then protecting the external walls of the glass portions 110 by a conforming deposition of a metallic layer 122 at least in contact with these external walls. On the example in FIG. 5, the metallic layer 122 also covers the side walls of the third substrate 114 and of the first substrate 102, and the upper face of the first substrate 102.

In the example embodiments described with reference to FIGS. 2A-2D, 3, 4 and 5, it is also possible to deposit a getter material in the cavity 108. The getter material can then be deposited directly on one or several of the walls of the cavity 108 formed by the substrates 102, 114 and/or the glass portions 110, and/or on at least part of the material that will form a barrier against noble gases present in the cavity 108. Thus, when the method comprises a step to make at least one portion of material impermeable to noble gases at least in contact with the side walls of the cavity and/or the upper wall of the cavity, the getter material may be made after this step.

Encapsulation of a single micro-device 100 is described in the previously described encapsulation methods. However, these methods are advantageously carried out collectively to encapsulate several micro-devices simultaneously, for example similar to the micro-device 100, in distinct cavities that are all formed from substrates 102, 104 and 114 and that are for example similar to the cavity 108. In this case, after the anodic bonding, elements (first substrate 102, glass portions 110, third substrate 114, and possibly metallic layer 116) forming the encapsulation structures are cut out such that each individually encapsulated micro-device 100 forms a chip independent of the other chips formed by the other encapsulated micro-devices. In the case previously described with reference to FIG. 5, deposition of the metallic layer 122 is implemented after these steps to cut and separate chips. This deposition of the metallic layer 122 can be made for several chips simultaneously.

The invention claimed is:

1. A method for encapsulating at least one micro-device, comprising at least the following steps:

bonding a face of a first substrate comprising at least one material impermeable to noble gases, in contact with a second substrate comprising glass and with a thickness of about 300 μm or more;

etching at least one cavity through the second substrate such that side walls of the cavity are at least partly formed by remaining portions of the second substrate and that an upper wall of the cavity is formed by part of said face of the first substrate;

anodic bonding of the remaining portions of the second substrate in contact with a third substrate in which the micro-device is formed, such that the micro-device is encapsulated in the cavity.

2. The method according to claim 1, in which the material impermeable to noble gases is silicon, and/or the glass in the second substrate is of the borosilicate type.

3. The method according to claim 1, also comprising a step prior to anodic bonding, to produce a getter material on the part of said face of the first substrate and/or on at least part of the side walls of the cavity and/or on at least part of the third substrate intended to be arranged in the cavity.

4. The method according to claim 1, also comprising thinning of the second substrate, between the step of bonding the first substrate in contact with the second substrate and the step of etching the cavity, to a thickness greater than or equal to about 10 μm.

5. The method according to claim 1, also comprising a step to make at least a portion of material impermeable to noble gases at least in contact with the side walls of the cavity, between the step of etching the cavity and the anodic bonding step.

6. The method according to claim 5, in which the portion of material impermeable to noble gases comprises at least a metal and/or silicon.

7. The method according to claim 5, in which the portion of material impermeable to noble gases also covers the upper wall of the cavity.

8. The method according to claim 5, in which the portion of material impermeable to noble gases forms a layer also in contact with the remaining portions of the second substrate, anodic bonding of the remaining portions of the second substrate in contact with the third substrate being carried out between the portion of material impermeable to noble gases and the third substrate.

9. The method according to claim 1, in which said method performs collective encapsulation of several micro-devices in distinct cavities, and also comprises a cutting step to provide a cut-out in at least the first substrate and the third substrate after anodic bonding of the remaining portions of the second substrate in contact with the third substrate, such that each of the encapsulated micro-devices forms a chip.

10. The method according to claim 9, also comprising, after the cutting step, a step of depositing at least one layer of material impermeable to noble gases in contact with at least external side walls of the remaining portions of the second substrate.

* * * * *